United States Patent
Suzuki et al.

(10) Patent No.: US 9,413,118 B2
(45) Date of Patent: Aug. 9, 2016

(54) CONNECTOR AND CONNECTOR ASSEMBLY

(71) Applicant: JAPAN AVIATION ELECTRONICS INDUSTRY, LIMITED, Shibuya-ku, Tokyo (JP)

(72) Inventors: Toshikazu Suzuki, Tokyo (JP); Naoki Kadowaki, Tokyo (JP); Yusuke Inoue, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 14/369,139

(22) PCT Filed: Nov. 6, 2012

(86) PCT No.: PCT/JP2012/078686
§ 371 (c)(1),
(2) Date: Jun. 26, 2014

(87) PCT Pub. No.: WO2013/103046
PCT Pub. Date: Jul. 11, 2013

(65) Prior Publication Data
US 2014/0357126 A1   Dec. 4, 2014

(30) Foreign Application Priority Data

Jan. 5, 2012   (JP) ................................. 2012-000425

(51) Int. Cl.
*H01R 13/66*    (2006.01)
*H01R 13/533*   (2006.01)
*G01R 15/20*    (2006.01)

(52) U.S. Cl.
CPC .......... *H01R 13/6683* (2013.01); *G01R 15/202* (2013.01); *G01R 15/207* (2013.01); *H01R 13/533* (2013.01)

(58) Field of Classification Search
CPC .. G01R 15/202; G01R 21/08; H01R 13/6683; H01R 39/58
USPC ...................................... 439/188, 620.01, 913
See application file for complete search history.

(56) References Cited

U.S. PATENT DOCUMENTS 4,002,396 A * 1/1977 Murdock ....................... 439/181
4,972,140 A   11/1990 Okazaki et al.
(Continued)

FOREIGN PATENT DOCUMENTS

JP      07280845 A    10/1995
JP      08017522 A     1/1996
(Continued)

OTHER PUBLICATIONS

Machine Translation for Japanese Document: JP2007178241, Inventor: Kuriyama Kenji.*

(Continued)

*Primary Examiner* — James Harvey
*Assistant Examiner* — Oscar C Jimenez
(74) *Attorney, Agent, or Firm* — Holtz, Holtz & Volek PC

(57) ABSTRACT

This connector can be connected to a counterpart connector having a counterpart contact, and is provided with an electric current sensor function. Specifically, the connector is provided with a contact, a protective member composed of an insulating material, a core, and an electric current detection member. The contact extends along the longitudinal direction so as to have a longitudinal part that can be connected to the counterpart contact. The protective member surrounds the contact in the plane orthogonal to the longitudinal direction. The core surrounds the protective member in the plane orthogonal to the longitudinal direction. The core has a gap. The electric current detection member is at least partially disposed within the gap.

14 Claims, 8 Drawing Sheets

(56) References Cited

U.S. PATENT DOCUMENTS

| | | | |
|---|---|---|---|
| 5,320,546 A * | 6/1994 | Weber | 439/188 |
| 5,340,325 A * | 8/1994 | Pai | 439/188 |
| 5,583,429 A | 12/1996 | Otaka | |
| 5,613,880 A * | 3/1997 | Wang | 439/620.03 |
| 6,008,634 A | 12/1999 | Murofushi et al. | |
| 2012/0313637 A1* | 12/2012 | Nakajima | G01R 33/04 324/253 |

FOREIGN PATENT DOCUMENTS

| | | | |
|---|---|---|---|
| JP | 10104279 A | 4/1998 | |
| JP | 2002148284 A | 5/2002 | |
| JP | 2002189038 A | 7/2002 | |
| JP | 3351502 B2 | 11/2002 | |
| JP | 2004219301 A | 8/2004 | |
| JP | 2006078255 A | 3/2006 | |
| JP | 2007178241 A | 7/2007 | |
| WO | 2005119851 A1 | 12/2005 | |

OTHER PUBLICATIONS

International Search Report (ISR) dated Feb. 12, 2013 issued in International Application No. PCT/JP2012/078686.

Japanese Office Action dated Aug. 29, 2013 issued in counterpart Japanese Application No. 2012-000425.

Extended European Search Report dated Jul. 28, 2015, issued in counterpart European Application No. 12864538.9.

European Office Action dated Feb. 23, 2016, issued in counterpart European Application No. 12864538.9.

* cited by examiner

CONNECTOR AND CONNECTOR ASSEMBLY

TECHNICAL FIELD

This invention relates to a connector having a current sensor function.

BACKGROUND ART

For example, this type of connector is disclosed in Patent Document 1. As shown in FIGS. 14A and 14B, the connector with built-in current sensor (connector) of Patent Document 1 comprises a ferrite bead (core), a hall element (current detection member) and a terminal (contact) fixed to a cable. The cable pierces the inside of the core to extend to the outside of the connector. The current detection member is detectable current which flows in the cable.

PRIOR ART DOCUMENTS

Patent Document(s)

Patent Document 1: JP B 3351502

SUMMARY OF INVENTION

Technical Problem

It is preferable that a contact is not fixed to be connected to a cable but is exchangeably connected to various connection objects (for example, a busbar and a cable with lug terminal). However, in the connector of Patent Document 1, the contact is accommodated within the connector in a state where the contact is fixed to the cable. Accordingly, the cable fixed to the contact of Patent Document 1 cannot be replaced with any other connection object.

Moreover, in the connector of Patent Document 1, if the cable is pulled, the positional relation between the cable and the core is changed so that the current detection accuracy becomes worse. In detail, the detected value of current becomes inaccurate when the cable is out of the center of the core, and the detected value of current is varied during the cable is pulled to be moved.

As a solution to solve the aforementioned problem, it is considered that the contact passes through the inside of the core. However, in general, a connector with a current sensor function is applied with large current of high voltage. Accordingly, if the contact of Patent Document 1 is modified to extend to the outside of the connector while passing through the inside of the core, dielectric breakdown might occur between the contact and the core.

It is therefore an object of the present invention to provide a connector which has a current sensor function and which allows its contact to be exchangeably connected to various connection objects while preventing dielectric breakdown.

Solution to Problem

An aspect of the present invention provides a connector connectable with a mating connector having a mating contact, wherein the connector has a current sensor function. The connector comprises a contact, a protection member made of an insulating material, a core and a current detection member. The contact extends along a front-rear direction to have a front end portion which is connectable to the mating contact. The protection member surrounds the contact in a plane perpendicular to the front-rear direction. The core surrounds the protection member in a plane perpendicular to the front-rear direction. The core has a gap. The current detection member is arranged, at least in part, within the gap.

Another aspect of the present invention provides a connector assembly comprising two or more of the connectors, a housing made of a metal and a holder. The holder is held by the housing. The holder is formed with a plurality of holding holes which correspond to the contacts, respectively. The core and the current detection member of each of the connectors are held in the corresponding one of the holding holes. The contact of each of the connectors pierces the corresponding one of the holding holes along the front-rear direction. The protection member of each of the connectors is received in the corresponding one of the holding holes.

Advantageous Effects of Invention

According to the present invention, the protection member made of the insulating material is arranged between the contact and the core. Accordingly, the contact may protrude outward from the connector while the dielectric breakdown is prevented, so that the contact can be connected to various connection objects.

An appreciation of the objectives of the present invention and a more complete understanding of its structure may be had by studying the following description of the preferred embodiment and by referring to the accompanying drawings.

DESCRIPTION OF EMBODIMENTS

Figure 1:
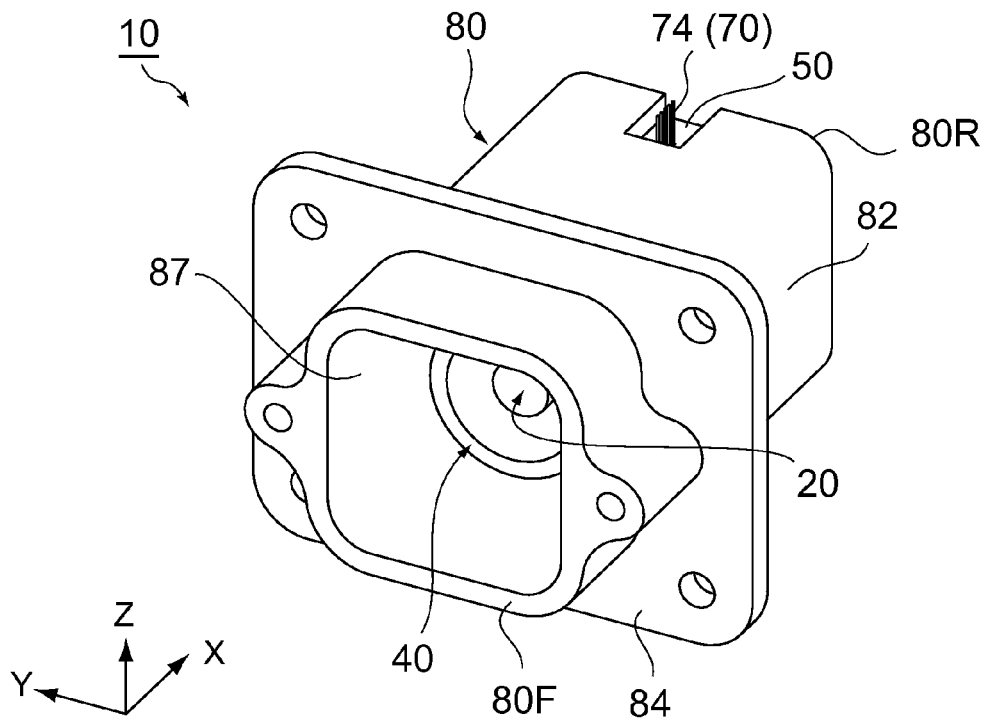
FIG. 1 is a perspective view showing a connector according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

First Embodiment

Figure 2:
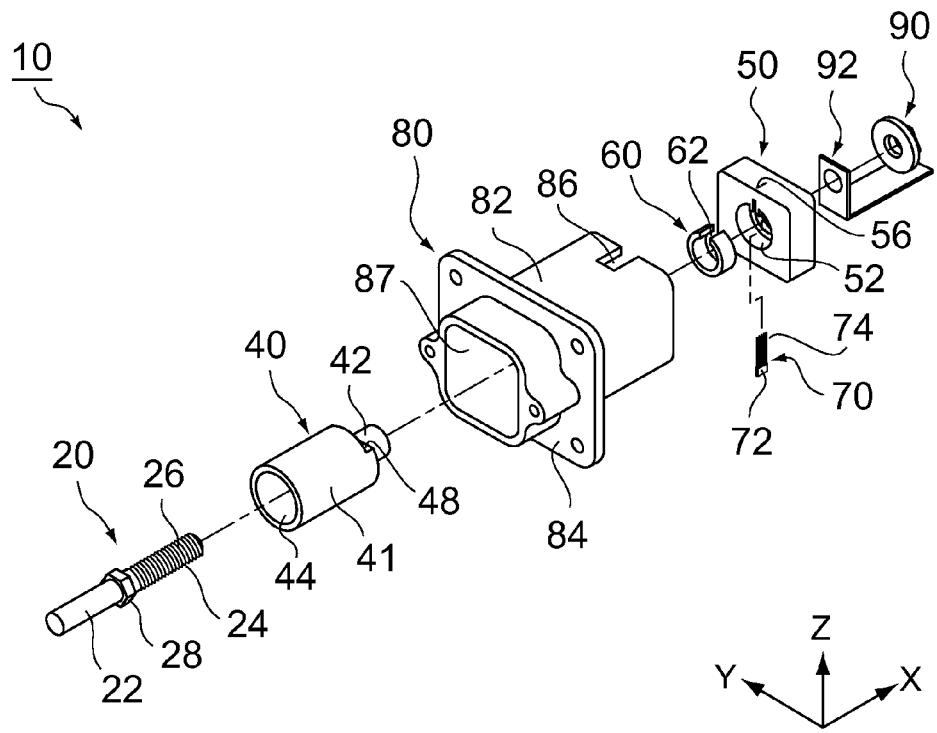
FIG. 2 is an exploded, perspective view showing the connector of FIG. 1 and a busbar attachable to the connector.

As shown in FIGS. 1 and 2, a connector 10 according to a first embodiment of the present invention comprises a pin contact (contact) 20 made of a conductive material, an insulator 40 made of an insulating material, a holder 50 made of an insulating material, a core 60 made of a soft magnetic material, a hall IC (current detection member) 70, a housing 80 made of a metal and a nut 90 made of a metal.

As shown in FIG. 2, the contact 20 cylindrically extends long along the X-direction (front-rear direction) to have a front end portion 22 (i.e. the negative X-side end portion) and a rear end portion 24 (i.e. the positive X-side end portion) in the X-direction. The contact 20 has a first regulation portion 28 formed between the front end portion 22 and the rear end portion 24. The first regulation portion 28 according to the present embodiment protrudes from a cylindrical portion of the contact 20 in a plane perpendicular to the X-direction to be formed in a hexagonal shape.

As can be seen from FIGS. 1 and 2, the front end portion 22 of the contact 20 is connectable to a mating contact (not shown) of a mating connector (not shown). In other words, the connector 10 is connectable with the mating connector (not shown) having the mating contact (not shown).

Figure 5:
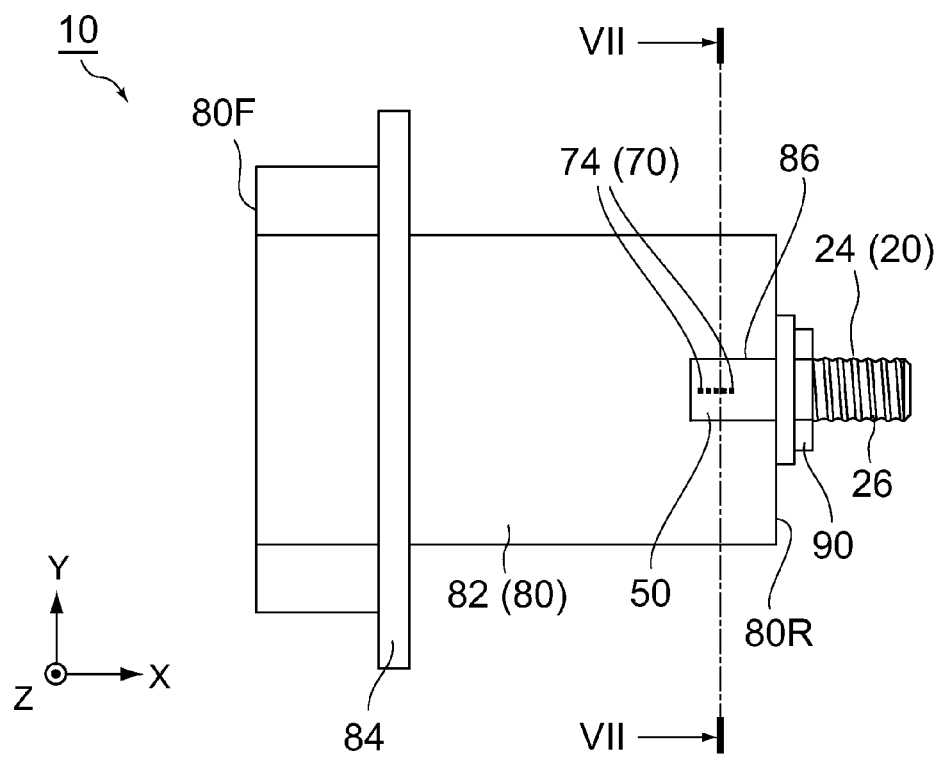
FIG. 5 is a top view showing the connector of FIG. 1.

As can be seen from FIGS. 2 and 5, the rear end portion 24 of the contact 20 is connectable to a connection object (for example, a busbar or a cable with lug terminal). In detail, the rear end portion 24 of the contact 20 passes through the inside of the insulator 40 and the holder 50 to project rearward (i.e. along the positive X-direction) from the connector 10. The rear end portion 24 is formed with a screw 26 which can be used together with the nut 90 to fix the contact 20 to the insulator 40 and the holder 50. Moreover, the holder 50 and the nut 90 can sandwich the connection object (for example, a busbar 92) therebetween to connect the rear end portion 24 of the contact 20 to the connection object.

Figure 6:
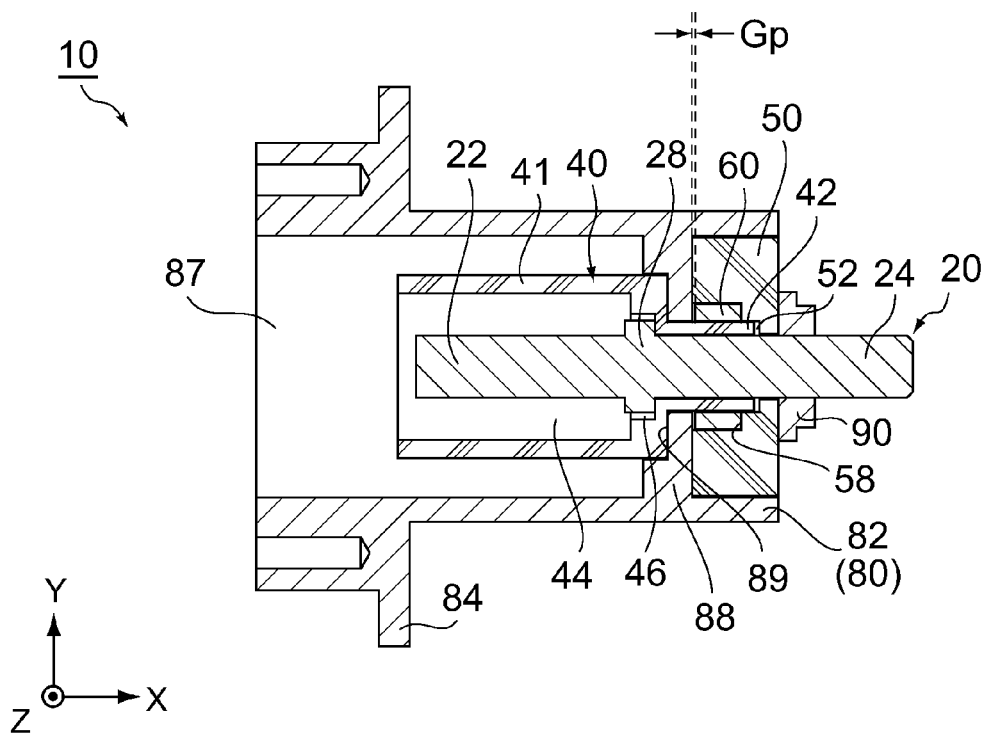
FIG. 6 is a cross-sectional view showing the connector of FIG. 4, taken along line VI-VI, wherein outlines of screwed threads of a contact are not illustrated.

As shown in FIGS. 2 and 6, the insulator 40 is formed in a cylindrical shape extending in the X-direction. In detail, the insulator 40 includes a body portion 41 (i.e. the negative X-side portion) having a relatively large external diameter and a protection member 42 (i.e. the positive X-side portion) having a relatively small external diameter. The body portion 41 is partially cut at its rear end portion (the positive X-side end portion) to be formed with a second regulation portion 48.

Figure 4:
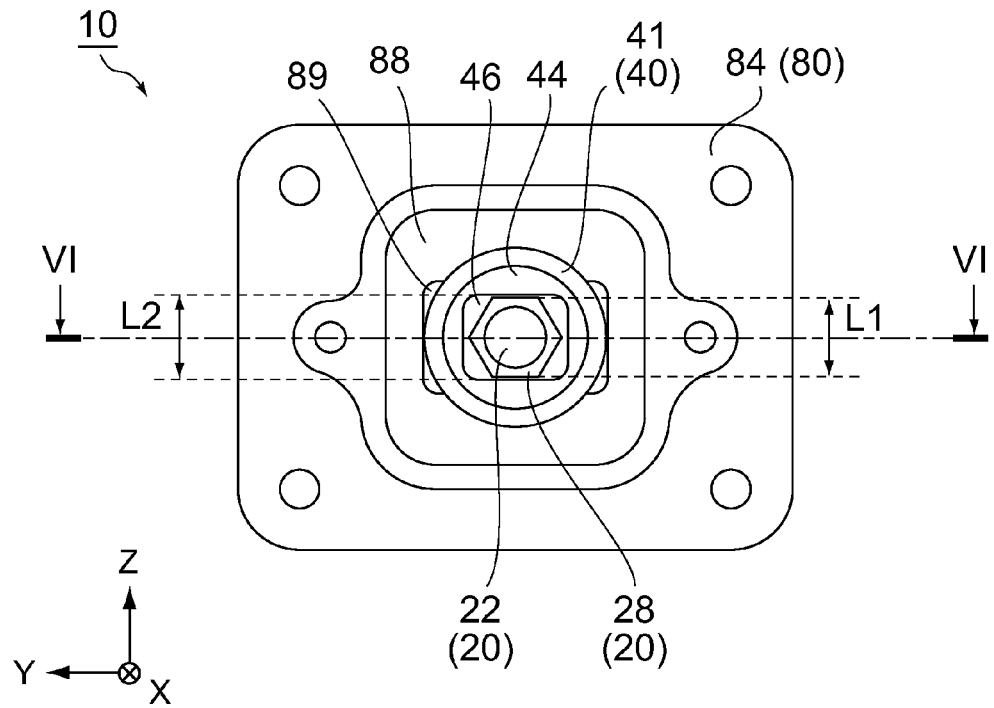
FIG. 4 is a front view showing the connector of FIG. 1.

As shown in FIGS. 2, 4 and 6, the inside of the insulator 40 is formed with an accommodation hole 44 which accommodates the contact 20. The accommodation hole 44 pierces the insulator 40 in the X-direction. A part of the rear end portion of the body portion 41 is located within the accommodation hole 44 to be partially recessed in the positive X-direction to be formed with a recess 46.

As shown in FIGS. 4 and 6, a part of the accommodation hole 44 is located within the body portion 41 to have an internal diameter larger than an external diameter of the first regulation portion 28 of the contact 20. In contrast, another part of the accommodation hole 44 is located within the protection member 42 to have another internal diameter smaller than the external diameter of the first regulation portion 28 and slightly larger than a diameter of the rear end portion 24 of the contact 20. Moreover, a length (L2) of the recess 46 in an up-down direction (Z-direction) is slightly longer than a length (L1) between two opposite sides of the first regulation portion 28. Moreover, a length of the recess 46 in a left-right direction (Y-direction) is longer than the external diameter of the first regulation portion 28.

Accordingly, the rear end portion 24 of the contact 20 is insertable rearward into the accommodation hole 44 so that the first regulation portion 28 is received into the recess 46. When the first regulation portion 28 is received in the recess 46, a rotation of the contact 20 around an axis in parallel to the X-direction is regulated upon screwing of the contact 20. In other words, according to the present embodiment, the first regulation portion 28, which is configured to regulate the rotation of the contact 20 around the axis in parallel to the X-direction, is provided to be located forward of a part of the contact 20 where the screw 26 is formed. Moreover, the connector 10 according to the present embodiment comprises a portion (i.e. the recess 46 that corresponds to the first regulation portion 28) which regulates a rotation of the first regulation portion 28. As can be seen from the above explanation, the shape of the first regulation portion 28 is not limited to the hexagonal shape. For example, the first regulation portion 28 may have a rectangular shape.

Figure 3:
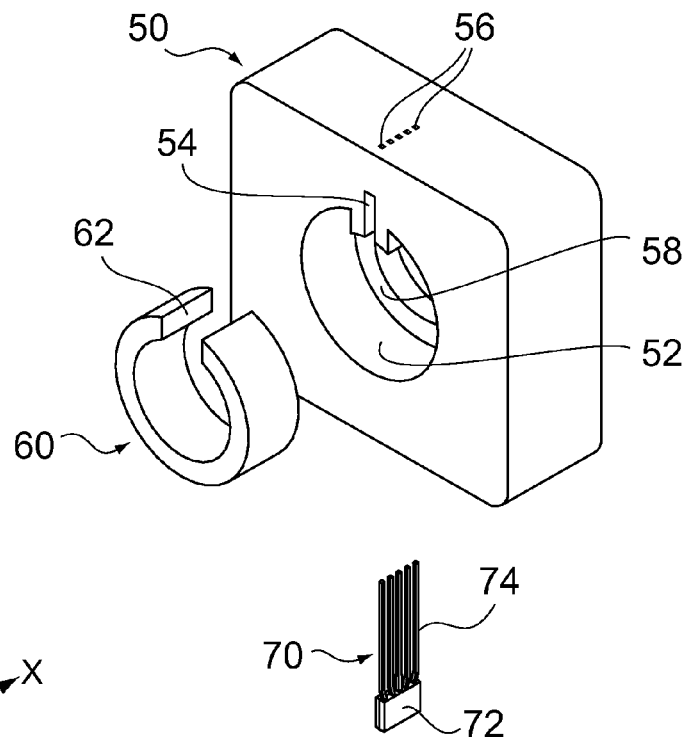
FIG. 3 is a perspective view showing a holder, a core and a hall IC of the connector of FIG. 2.

As shown in FIGS. 2 and 3, the holder 50 according to the present embodiment has a rectangular shape in the plane perpendicular to the X-direction. The holder 50 is formed with a holding hole 52 which pierces the holder 50 in the X-direction. The holding hole 52 is formed to include a rear side (i.e. the positive X-side) having a diameter smaller than another diameter of a front side (i.e. the negative X-side) thereof. More specifically, the middle part of the holding hole 52 in the X-direction protrudes toward the central axis, which extends in parallel to the X-direction, of the holding hole 52 to form a protruding portion 58. The holding hole 52 is formed with a holding ditch 54 in the vicinity of an upper end (i.e. the positive Z-side end) thereof. The holding ditch 54 extends upward (i.e. along the positive Z-direction) from the holding hole 52. The parts located at opposite sides of the holding ditch 54 in the Y-direction project downward (i.e. along the negative Z-direction). The holding ditch 54 is formed with a plurality of terminal holes 56 at the upper end thereof. Each of the terminal holes 56 further extends upward from the holding ditch 54 to pierce the holder 50 in the Z-direction.

The core 60 according to the present embodiment is formed of a ferrite, a silicon steel plate, a dust magnetic body, an amorphous material or the like. The core 60 has a ring shape which is partially cut-off. In other words, the core 60 has a gap 62 for generating electro-magnetic field.

The hall IC 70 according to the present embodiment includes a body portion 72 and a plurality of terminals 74. The body portion 72 is configured to detect electric current when being placed in the electro-magnetic field. The terminals 74 extend upward from the body portion 72 to be connectable to an outward electronic circuit (not shown). The terminals 74 are constituted of, for example, an input terminal and an output terminal. The output terminal is able to output the value of the electric current detected by the body portion 72 to the outward electronic circuit (not shown). Although the hall IC 70 according to the present embodiment has the five terminals 74, the number of the terminals 74 is not limited to five. Moreover, the current detection member 70 may not be the hall IC 70, provided that the electric current can be detected in combination with the core 60.

As can be seen from FIGS. 1 to 3 and 7, the body portion 72 of the hall IC 70 is held by the holding ditch 54 of the holder 50 while the terminals 74 are inserted in the terminal holes 56, respectively. The upper end portions (i.e. the positive Z-side end portions) of the terminals 74 project over the holder 50.

As can be seen from FIGS. 2, 3, 6 and 7, the core 60 is fit in the holding hole 52 from the front of the holder 50 to be brought into abutment with the protruding portion 58. The body portion 72 of the hall IC 70 is located in the gap 62 of the core 60 in the Y-direction. In other words, the core 60 and the hall IC 70 are held in the holding hole 52. More specifically, the core 60 and the hall IC 70 are adhered or press-fit in the holding hole 52.

As shown in FIGS. 1 and 2, the housing 80 according to the present embodiment extends in the X-direction to have a front end 80F (i.e. the negative X-side end) and a rear end 80R (i.e. the positive X-side end) in the X-direction. In detail, the housing 80 includes a cylindrical portion 82 and a flange 84, wherein the cylindrical portion 82 has a rectangular cylindrical shape extending in the X-direction, and the flange 84 protrudes from the cylindrical portion 82 in the plane perpendicular to the X-direction. The flange 84 is formed with a plurality of screw holes for attaching the connector 10, for example, to an apparatus (not shown). The cylindrical portion 82 is formed with a cut 86 in the vicinity of the rear end 80R thereof. The cylindrical portion 82 according to the present embodiment wholly covers the connector 10, except a portion corresponding to the cut 86, in the plane perpendicular to the X-direction to be efficiently preventable Electro Magnetic Interference (EMI).

As shown in FIGS. 1 and 6, the cylindrical portion 82 is formed with a piercing hole 87 which pierces through the cylindrical portion 82 in the X-direction. The inside of the cylindrical portion 82 is formed with a partition wall 88 having a plate-like shape perpendicular to the X-direction (see FIG. 6). The partition wall 88 is formed with a hole at the middle thereof, wherein the hole allows for the protection member 42 of pass therethrough. In other words, the piercing hole 87 is divided by the partition wall 88 into two holes which communicate with each other.

One of the aforementioned two holes located at the negative X-side (i.e. the negative X-side hole) functions as a mating portion to be mated with the mating connector (not shown). In the other one located at the positive X-side (i.e. the positive X-side hole), the holder 50 is inserted while the upper end portions of the terminals 74 pass through the cut 86 of the cylindrical portion 82 to extend upward. In other words, the housing 80 holds the holder 50, and the cut 86 of the cylindrical portion 82 is formed at the position corresponding to the terminals 74 of the hall IC 70. According to the present embodiment, the positive X-side hole has a rectangular shape corresponding to the shape of the holder 50 in the plane perpendicular to the X-direction to prevent a rotation of the holder 50 upon screwing of the contact 20. The holder 50 may have, for example, a disc-like shape. However, in this case, it is preferable to provide a portion which is preventable the rotation of the holder 50.

As shown in FIGS. 4 and 6, the middle part of the partition wall 88 is depressed in the positive X-direction to be formed with a depression 89. The depression 89 is formed to have a shape corresponding to the second regulation portion 48 of the insulator 40. When the contact 20 is screwed, an engagement of the second regulation portion 48 with the depression 89 prevents a rotation of the insulator 40. In other words, the insulator 40 according to the present embodiment is provided with the second regulation portion 48 which is configured to regulate the rotation of the insulator 40 around an axis in parallel to the X-direction. Moreover, the connector 10 according to the present embodiment comprises a portion for regulating the rotation of the second regulation portion 48 (i.e. the depression 89 corresponding to the second regulation portion 48).

As can be seen from FIG. 2, the connector 10 according to the present embodiment can be assembled as described below. First, the hall IC 70 and the core 60 are attached to the holder 50. Subsequently, the insulator 40 is attached to the housing 80 from the front (i.e. along the positive X-direction) while the second regulation portion 48 is arranged at its proper position. Subsequently, the contact 20 is attached to the insulator 40 from the front while the first regulation portion 28 is arranged at its proper position. Subsequently, the holder 50 is attached to the housing 80 from the rear (i.e. along the negative X-direction) while the contact 20 passes through the holding hole 52. Subsequently, the nut 90 is screwed to the screw 26 of the contact 20 to fix the whole of the connector 10. At that time, the screw 26 of the contact 20 can be attached to the connection object such as the busbar 92.

As can be seen from the above explanation, according to the present embodiment, the connection object connected to the contact 20 can be easily replaced. Accordingly, the connection object can be replaced, for example, in correspondence with the use of the connector 10. Moreover, according to the present embodiment, the holder 50 can be easily replaced. For example, when the material of the core 60 is changed to satisfy the measurement accuracy of the electric current, the size of the core 60 may be changed. According to the present embodiment, even in such a case, the holder 50 can be replaced to a proper holder 50 including a proper core 60 and a proper hall IC 70 without changing the interface for the housing 80, the contact 20 and so on.

Figure 7:
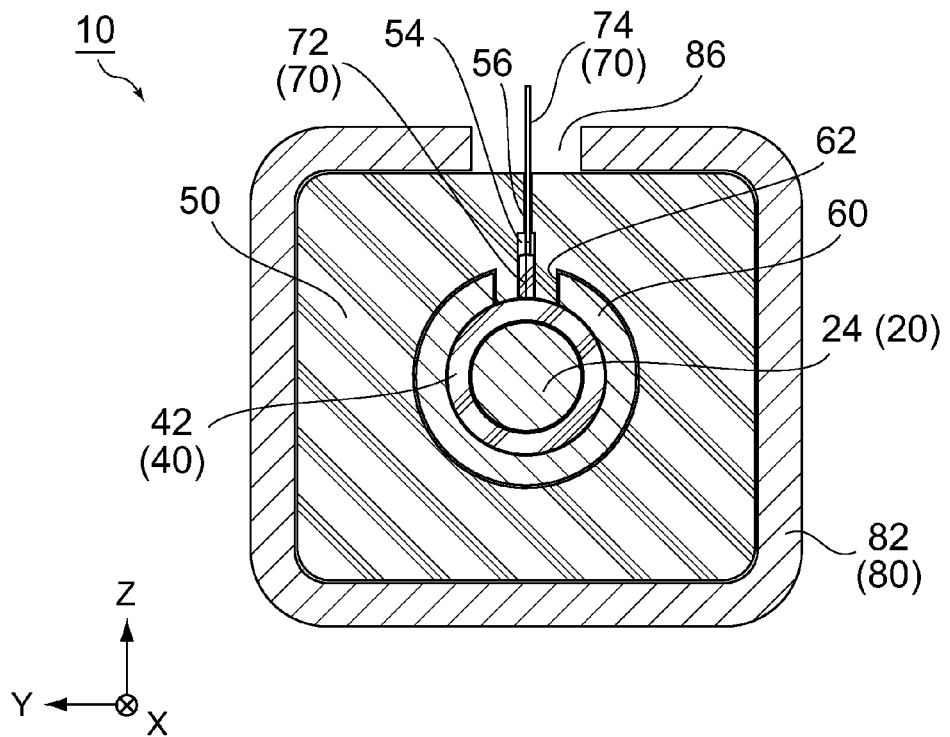
FIG. 7 is a cross-sectional view showing the connector of FIG. 5, taken along line VII-VII.

As shown in FIG. 7, the protection member 42 surrounds the rear end portion 24 of the contact 20 in the plane perpendicular to the X-direction. The core 60 has the gap 62 and surrounds the protection member 42 in the plane perpendicular to the X-direction. The body portion 72 of the hall IC 70 is arranged, at least in part, within the gap 62. As can be seen from the aforementioned structure, the connector 10 according to the present embodiment has a current sensor function that detects the electric current flowing through the contact 20. Moreover, since the protection member 42 made of the insulating material is arranged between the contact 20 and the core 60, dielectric breakdown is prevented.

As shown in FIG. 6, the contact 20 according to the present embodiment pierces the holding hole 52 along the X-direction. The protection member 42 is received in the holding hole 52 while hiding the core 60 from the contact 20. More specifically, the protection member 42 protrudes forward and rearward beyond the core 60 in the X-direction. According to the present embodiment, the dielectric breakdown can be therefore prevented more effectively. Moreover, according to the present embodiment, the core 60 is wholly accommodated within the holding hole 52. More specifically, the front end (the negative X-side end) of the holder 50 protrudes in the negative X-direction by a distance Gp beyond the front end (the negative X-side end) of the core 60. This structure prevents the core 60 from being brought into contact with the housing 80. However, in some cases, the core 60 and the housing 80 may be allowed to be brought into contact with each other.

According to the present embodiment, the protection member 42 is a part of the insulator 40. The insulator 40 extends forward from the protection member 42 to surround the contact 20 in the plane perpendicular to the X-direction. In other words, the insulator 40 according to the present embodiment covers the contact 20 in a wide range extending from the front end portion 22 to the rear end portion 24. According to the present embodiment, the dielectric breakdown and short circuit can be therefore prevented more securely.

Second Embodiment

Figure 8:
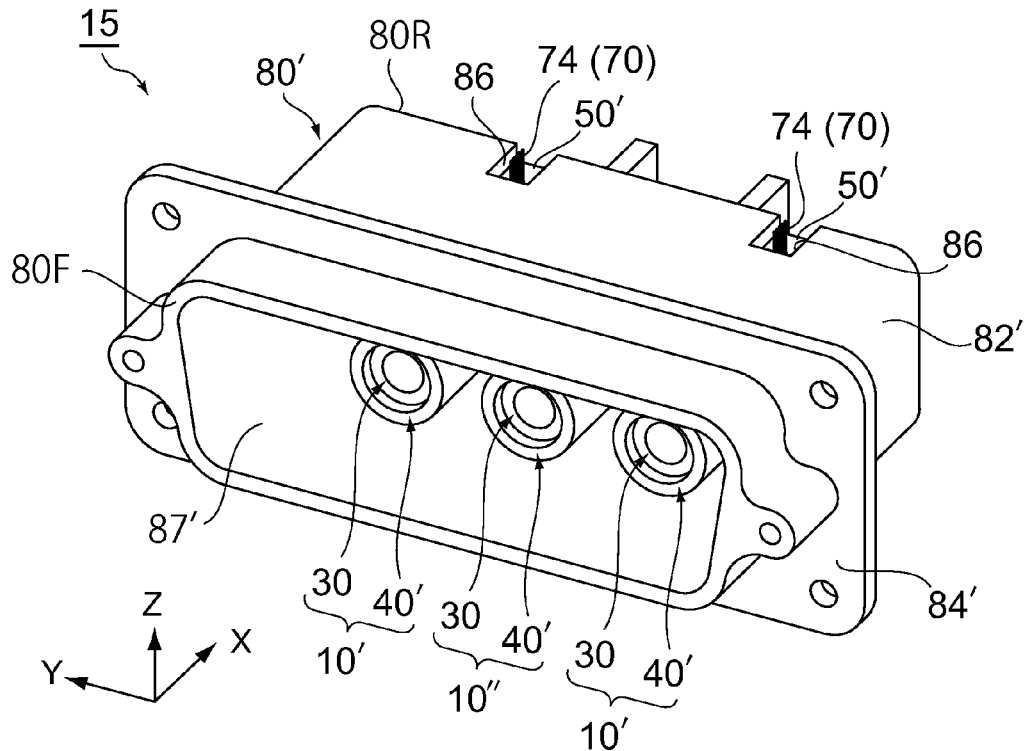
FIG. 8 is a perspective view showing a connector assembly according to a second embodiment of the present invention.
Figure 9:
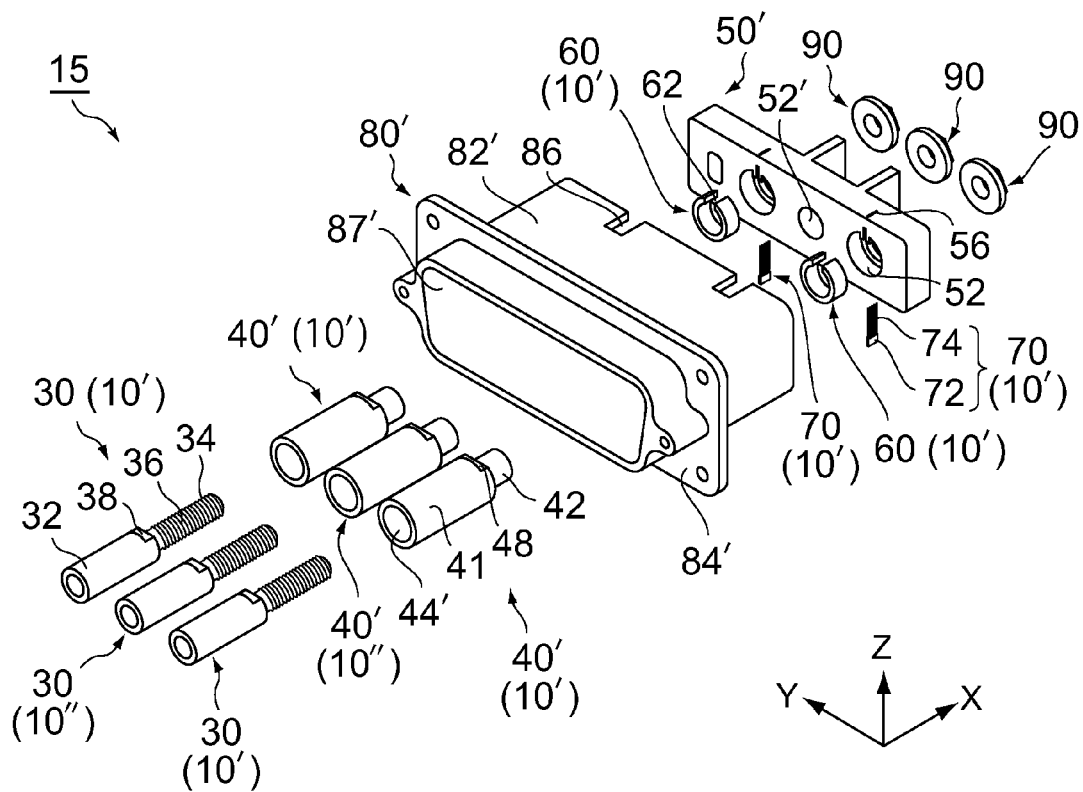
FIG. 9 is an exploded, perspective view showing the connector assembly of FIG. 8.

As shown FIGS. 8 and 9, a connector assembly 15 according to a second embodiment of the present invention is a connector assembly through which three-phase alternating current flows. The connector assembly 15 comprises two connectors 10', one connector 10'', one holder 50' made of an insulating material and one housing 80' made of a metal. The connector 10'' is located between the two connectors 10' in the Y-direction.

The connector 10' includes a socket contact (contact) 30 made of a conductive material, an insulator 40' made of an insulating material, the core 60, the hall IC (current detection member) 70 and the nut 90. The connector 10' according to the present embodiment is configured similar to the connector 10 to have the current sensor function. According to the present embodiment, a value of the electric current flowing through the connector 10'' can be calculated from electric current values measured by using the two connectors 10'. Accordingly, the connector 10'' according to the present embodiment includes the contact 30, the insulator 40' and the nut 90 while not including the core 60 and the hall IC 70 (i.e. the current sensor function). However, the connector 10'' may include the current sensor function. In other words, the connector assembly 15 may comprises three of the connectors 10'.

As shown in FIG. 9, similar to the contact 20, the contact 30 cylindrically extends long along the X-direction to have a front end portion 32 (i.e. the negative X-side end portion) and a rear end portion 34 (i.e. the positive X-side end portion) in the X-direction. The front end portion 32 has a diameter larger than another diameter of the rear end portion 34. The contact 30 has a first regulation portion 38 formed at the front end portion 32. Similar to the first regulation portion 28, the first regulation portion 38 according to the present embodiment is configured to regulate a rotation of the contact 30 around an axis in parallel to the X-direction.

As can be seen from FIGS. 8 and 9, the front end portion 32 of the contact 30 is connectable to a mating contact (not shown) of a mating connector (not shown).

Figure 10:
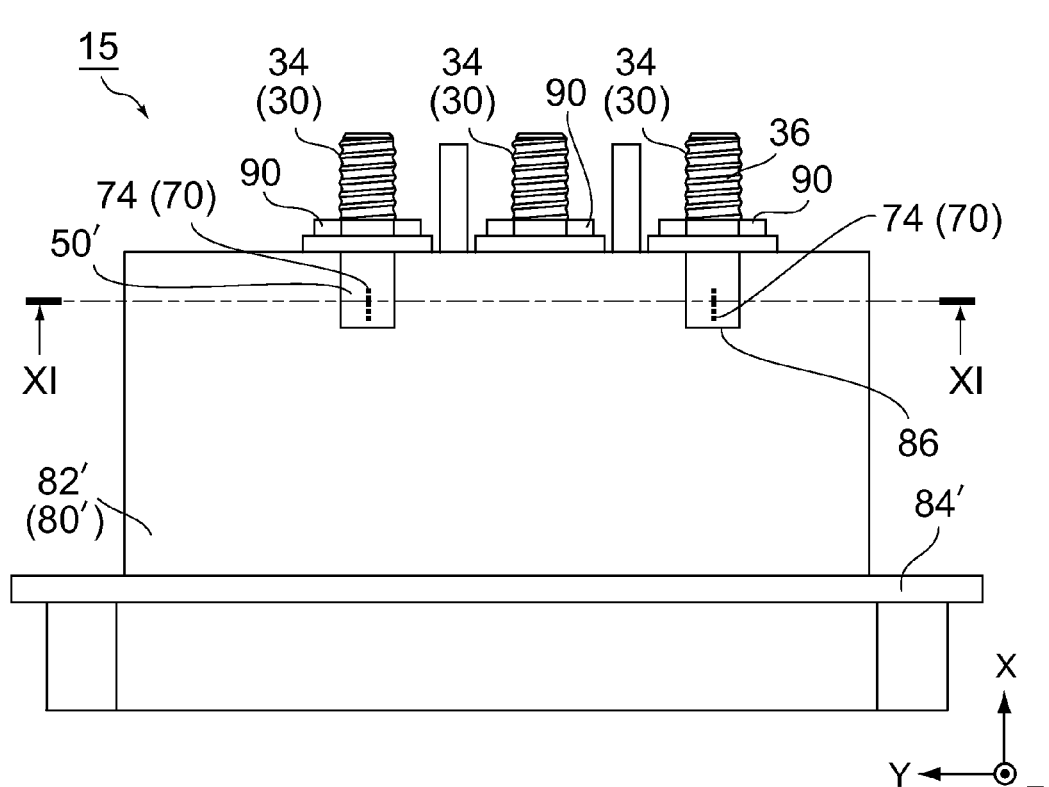
FIG. 10 is a top view showing the connector assembly of FIG. 8.

As can be seen from FIGS. 9 and 10, the rear end portion 34 of the contact 30 is connectable to the connection object. In detail, the rear end portion 34 of the contact 30 passes through the inside of the insulator 40' and the holder 50' to project rearward from the connector assembly 15. The rear end portion 34 is formed with a screw 36 which can be used together with the nut 90 to fix the contact 30 to the insulator 40' and the holder 50'. Moreover, the holder 50' and the nut 90 can sandwich the connection object therebetween to connect the rear end portion 34 of the contact 30 to the connection object.

As shown in FIG. 9, similar to the insulator 40, the insulator 40' has a cylindrical shape extending in the X-direction. In detail, the insulator 40' includes the body portion 41, the protection member 42 and the second regulation portion 48.

As shown in FIG. 9, the inside of the insulator 40' is formed with an accommodation hole 44' which accommodates the contact 30. Similar to the accommodation hole 44, the accommodation hole 44' pierces the insulator 40' in the X-direction.

As can be seen from FIG. 9, a part of the accommodation hole 44' is located within the body portion 41 to have an internal diameter larger than the diameter of the front end portion 32 of the contact 30. In contrast, another part of the accommodation hole 44' is located within the protection member 42 to have another internal diameter smaller than the diameter of front end portion 32 and slightly larger than the diameter of the rear end portion 34 of the contact 30. Moreover, the inside of the accommodation hole 44' is formed with a portion engageable with the second regulation portion 48. Accordingly, when the rear end portion 34 of the contact 30 is inserted in the accommodation hole 44' along the X-direction in a state where the first regulation portion 38 is arranged at its proper position, a rotation of the contact 30 around an axis extending in the X-direction is regulated.

As shown in FIG. 9, the holder 50' according to the present embodiment has a rectangular shape in the plane perpendicular to the X-direction. The holder 50' is formed with the two holding holes 52 and one holding hole 52', wherein the holding holes 52 correspond to the two connector 10', respectively, while the holding hole 52' corresponds to the connector 10''. The holding hole 52' is located between the two holding holes 52 in the Y-direction.

As shown in FIGS. 8 and 9, the housing 80' according to the present embodiment is formed in a shape similar to that of the housing 80 to have the front end 80F and the rear end 80R in the X-direction. In detail, the housing 80' includes a cylindrical portion 82' and a flange 84', wherein the cylindrical portion 82' has a rectangular cylindrical shape extending in the X-direction, and the flange 84' protrudes from the cylindrical portion 82' in the plane perpendicular to the X-direction. The flange 84' is formed with a plurality of screw holes for attaching the connector assembly 15, for example, to an apparatus (not shown). The cylindrical portion 82' is formed with the two cuts 86 in the vicinity of the rear end 80R thereof. The cylindrical portion 82' according to the present embodiment wholly covers the connector assembly 15, except portions corresponding to the cuts 86, in the plane perpendicular to the X-direction to be efficiently preventable Electro Magnetic Interference (EMI).

As shown in FIGS. 8, 9, 12 and 13, similar to the cylindrical portion 82, the cylindrical portion 82' is formed with a piercing hole 87' which pierces through the cylindrical portion 82' in the X-direction. The inside of the cylindrical portion 82' is formed with a partition wall 88' having a plate-like shape perpendicular to the X-direction. The partition wall 88' is formed with three holes at the middle thereof, wherein the holes allow for the protection members 42 of the insulators 40' to pass therethrough, respectively. In other words, the piercing hole 87' is divided by the partition wall 88' into two holes which communicate with each other. One of the two holes of the piercing hole 87' is located at the negative X-side to function as a mating portion which is to be mated with the mating connector (not shown). The holder 50' is inserted and held in the other one which is located at the positive X-side, while the upper end portions of the terminals 74 pass through the cut 86 of the cylindrical portion 82' to extend upward.

As can be seen from FIG. 9, the connector assembly 15 according to the present embodiment can be assembled as described below. First, the hall IC 70 and the core 60 are attached to each of the two holding holes 52 of the holder 50'. Subsequently, each of the three insulators 40' is attached to the housing 80' from the front while the second regulation portion 48 is arranged at its proper position. Subsequently, the three contacts 30 are attached to the three insulators 40' from the front, respectively, while the first regulation portions 38 are arranged at their proper positions. Subsequently, the holder 50' is attached to the housing 80' from the rear while each of the contacts 30 passes through the corresponding one of the holding holes 52 and the holding hole 52'. Subsequently, the nuts 90 are screwed to the screws 36 of the contacts 30, respectively, to fix the whole of the connector assembly 15. At that time, the contact 30 can be attached to the connection object (for example, the busbar 92).

According to the first embodiment and the present embodiment, the second regulation portion 48 is formed on the body portion 41. However, the second regulation portion 48 may be formed on the protection member 42. For example, the protection member 42 may be formed with a planar part over its full extent in the X-direction to function as the second regulation portion 48. Alternatively, the front end portion (the negative X-side end portion) of the protection member 42 may be partially formed planarly to be provided with the second regulation portion 48. However, in this case, the shape of the portion, which is a part of the connector 10 (or the connector 10') and corresponds to the second regulation portion 48, needs to be modified. For example, the housing 80 (or the housing 80') needs to be provided with a hole which has a shape corresponding to the second regulation portion 48 formed on the protection member 42.

As can be seen from the above explanation, according to the present embodiment, the connection object connected to the contact 30 can be easily replaced similar to the first embodiment. Moreover, the holder 50' can be easily replaced.

Figure 11:
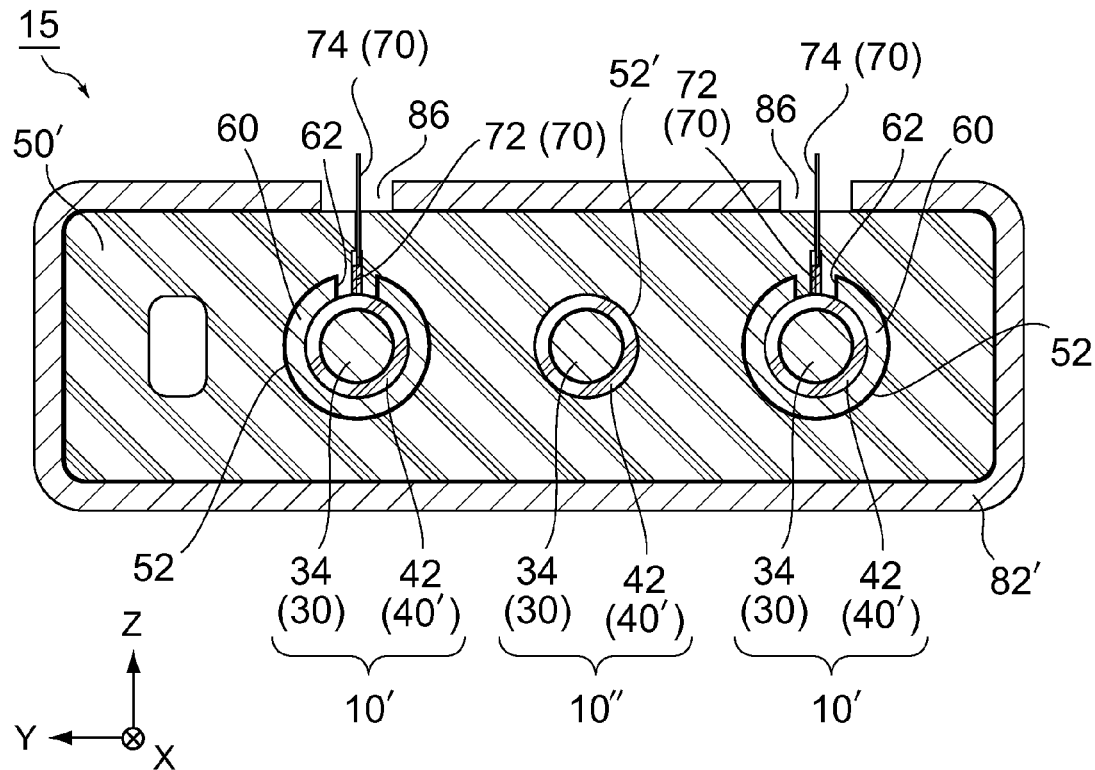
FIG. 11 is a cross-sectional view showing the connector assembly of FIG. 10, taken along line XI-XI.
Figure 12:
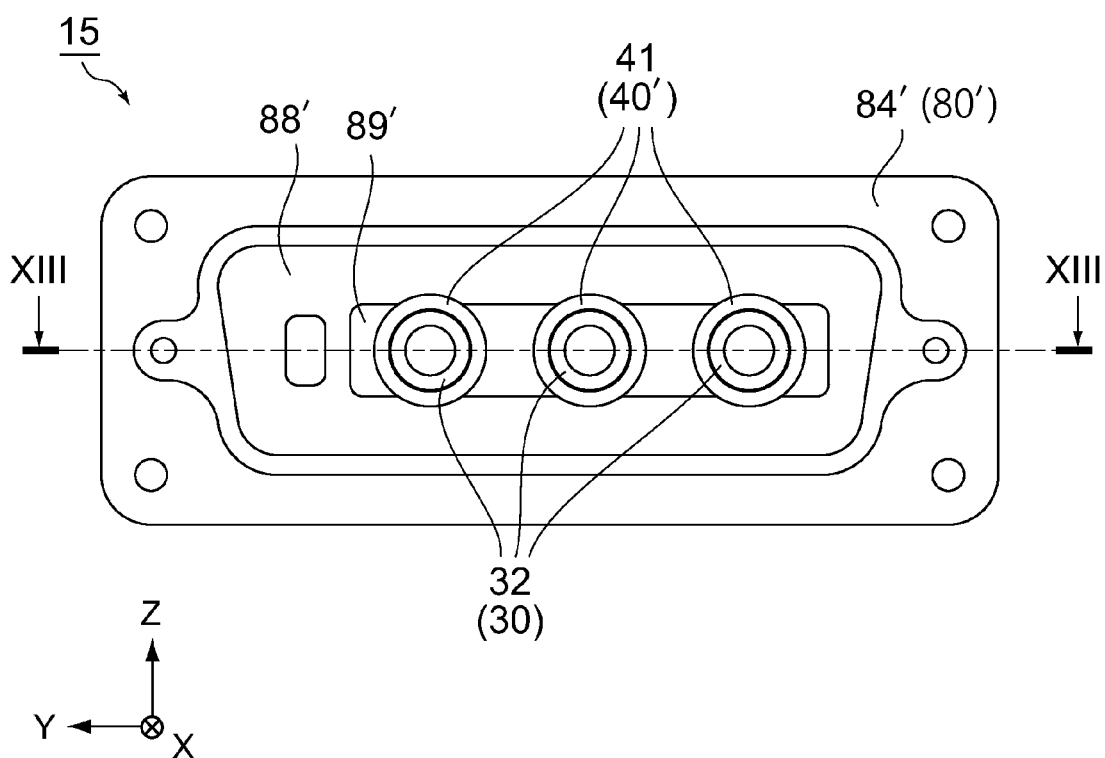
FIG. 12 is a front view showing the connector assembly of FIG. 8.
Figure 13:
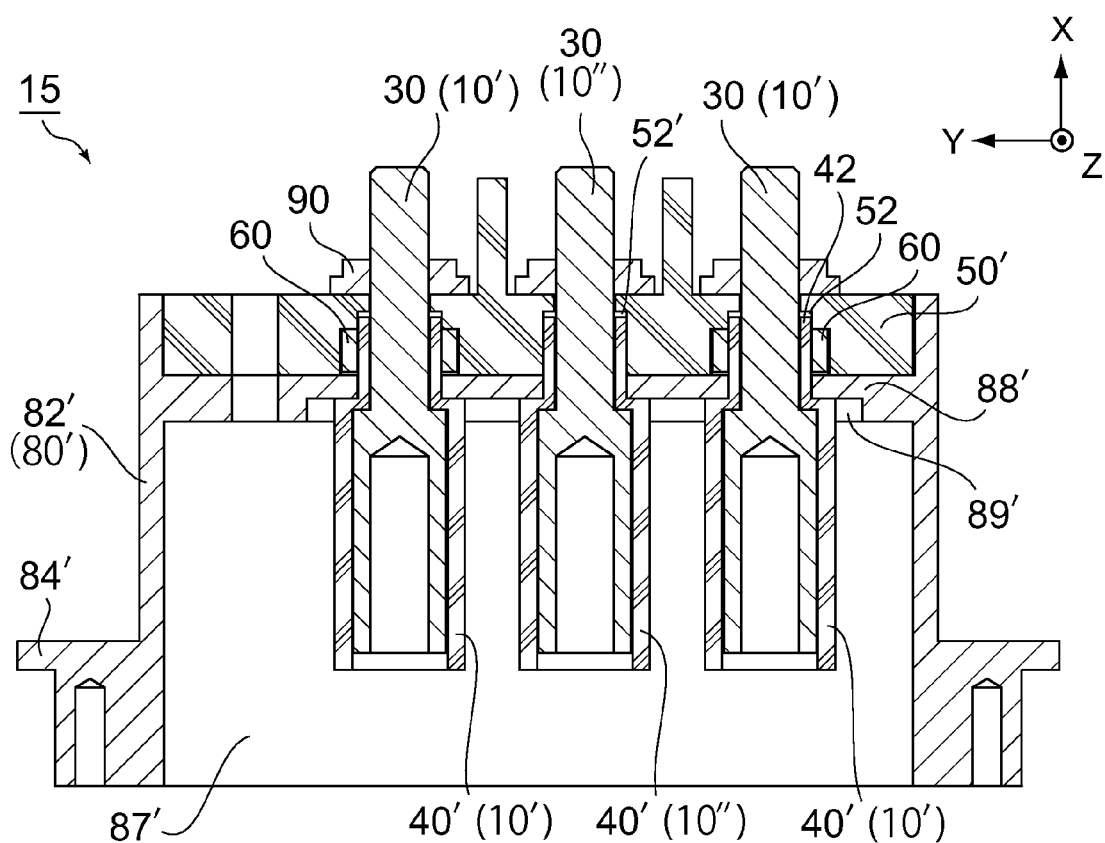
FIG. 13 is a cross-sectional view showing the connector assembly of FIG. 12, taken along line XIII-XIII, wherein outlines of screwed threads of contacts are not illustrated.
Figure 14A:
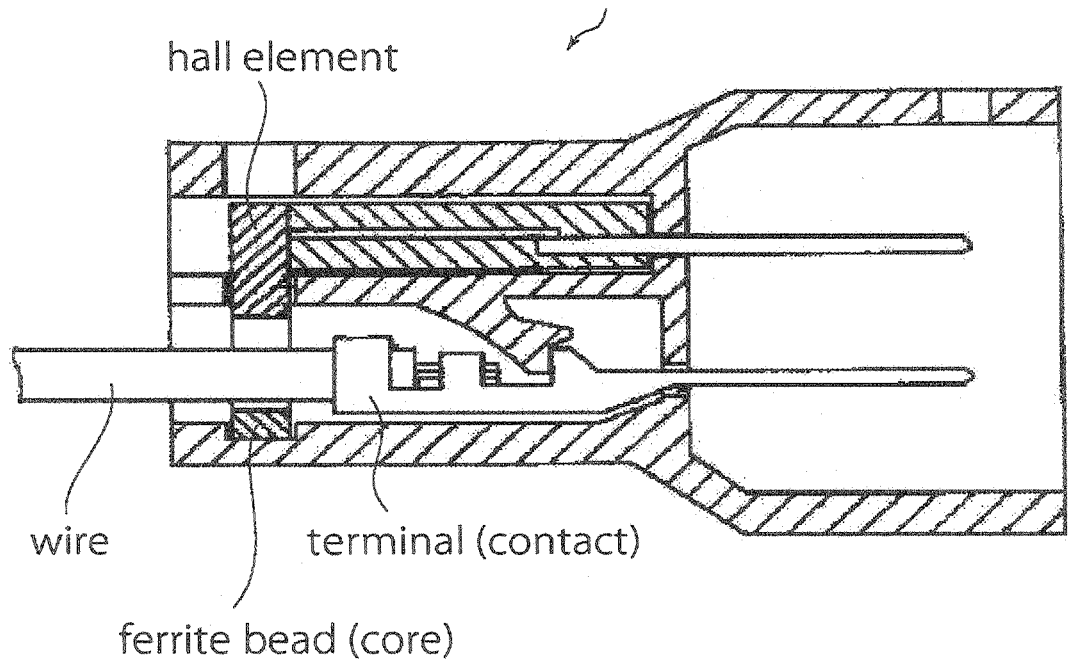
FIG. 14A is a cross-sectional view showing an example of existing connector.
Figure 14B:
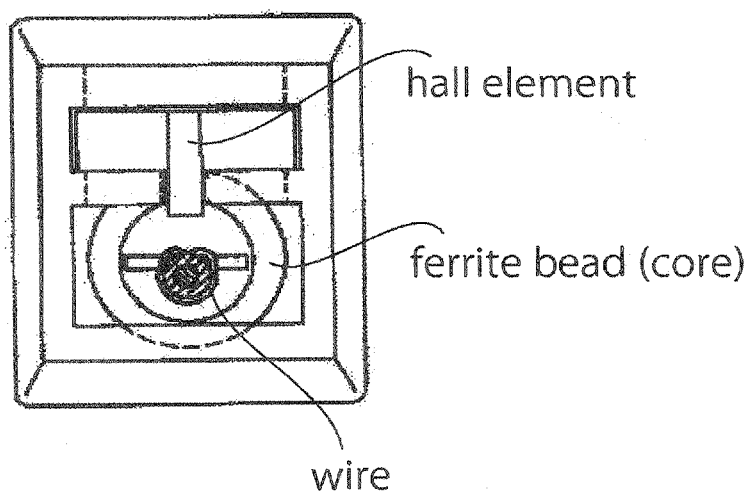
FIG. 14B is a front view showing the connector of FIG. 14A.

As shown in FIGS. 11 and 13, the core 60 and the hall IC 70 of the connector 10' are held in the corresponding one of the holding holes 52. The contact 30 pierces the corresponding one of the holding holes 52 and the holding hole 52' along the X-direction. The protection member 42 is received in the corresponding one of the holding holes 52 and the holding hole 52' while hiding the core 60 from the contact 30.

As shown in FIG. 11, the protection member 42 of the connector 10' surrounds the contact 30 in the plane perpendicular to the X-direction. The core 60 of the connector 10' has the gap 62 and surrounds the protection member 42 in the plane perpendicular to the X-direction. The body portion 72 of the hall IC 70 of the connector 10' is arranged, at least in part, within the gap 62. Since the connector 10' is configured as described above, the electric current flowing through the contact 30 can be detected. Moreover, since the protection member 42 made of the insulating material is arranged between the contact 30 and the core 60, the dielectric breakdown is prevented.

The contact 20 according to the first embodiment is a pin contact, while the contact 30 according to the second embodiment is a socket contact. However, the contact 20 may be a socket contact, and the contact 30 may be a pin contact. Moreover, for example, each of the contact 20 and the contact 30 may be a plate-like contact.

Moreover, the connector assembly comprising a plurality of the connectors is not limited to that for three-phase alternating current. For example, the connector assembly may be an assembly comprising two or more connectors each of which independently supplies electric current.

The present application is based on a Japanese patent application of JP2012-000425 filed before the Japan Patent Office on Jan. 5, 2012, the content of which is incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST 10, 10', 10" connector
15 connector assembly
20 pin contact (contact)
22 front end portion
24 rear end portion
26 screw
28 first regulation portion
30 socket contact (contact)
32 front end portion
34 rear end portion
36 screw
38 first regulation portion
40, 40' insulator
41 body portion
42 protection member
44, 44' accommodation hole
46 recess
48 second regulation portion
50, 50' holder
52, 52' holding hole
54 holding ditch
56 terminal hole
58 protruding portion
60 core
62 gap
70 hall IC (current detection member)
72 body portion
74 terminal
80, 80' housing
80F front end
80R rear end
82, 82' cylindrical portion
84, 84' flange
86 cut
87, 87' piercing hole
88, 88' partition wall
89, 89' depression
90 nut
92 busbar

The invention claimed is:

1. A connector connectable with a mating connector having a mating contact, the connector having a current sensor function and comprising:
   a contact extending along a front-rear direction and having a front end portion which is connectable to the mating contact;
   a protection member made of an insulating material, the protection member surrounding the contact in a plane perpendicular to the front-rear direction;
   a core having a gap for generating electro-magnetic field, the core surrounding the protection member in a plane perpendicular to the front-rear direction;
   a current detection member including a terminal connectable to an outward electronic circuit, the current detection member being arranged, at least in part, within the gap; and
   a holder formed with a holding hole,
   wherein:
   the core and the current detection member are held in the holding hole;
   a part of the holder is located within the gap;
   the contact pierces the holding hole along the front-rear direction; and
   the protection member is received in the holding hole.

2. The connector as recited in claim 1, wherein the holder has a rectangular shape in a plane perpendicular to the front-rear direction.

3. The connector as recited in claim 1, wherein:
the connector further comprises a housing made of a metal; and
the housing holds the holder.

4. The connector as recited in claim 1, wherein the protection member protrudes rearward beyond the core in the front-rear direction.

5. The connector as recited in claim 1, wherein the contact has a rear end portion which is formed with a screw.

6. The connector as recited in claim 5, wherein:
the contact is provided with a first regulation portion which is configured to regulate a rotation of the contact around an axis in parallel to the front-rear direction; and
the first regulation portion is located forward of a part of the contact where the screw is formed.

7. The connector as recited in claim 6, wherein the connector further comprises a portion which regulates a rotation of the first regulation portion.

8. The connector as recited in claim 1, wherein:
the connector further comprises an insulator; and
the protection member is a part of the insulator.

9. The connector as recited in claim 8, wherein the insulator extends forward from the protection member to surround the contact in a plane perpendicular to the front-rear direction.

10. The connector as recited in claim 8, wherein the insulator is provided with a second regulation portion which is configured to regulate a rotation of the insulator around an axis in parallel to the front-rear direction.

11. The connector as recited in claim 10, wherein the connector further comprises a portion which regulates a rotation of the second regulation portion.

12. The connector as recited in claim 1, wherein the contact is a pin contact.

13. The connector as recited in claim 1, wherein the contact is a socket contact.

14. A connector assembly comprising:
two or more connectors,
a housing made of a metal, and
a holder,
wherein:
each connector has a current sensor function;
each connector is mateable with a mating connector having a mating contact;
each connector comprises:
a contact extending along a front-rear direction and having a front end portion which is connectable to the mating contact;
a protection member made of an insulating material, the protection member surrounding the contact in a plane perpendicular to the front-rear direction;
a core having a gap for generating electro-magnetic field, the core surrounding the protection member in a plane perpendicular to the front-rear direction; and
a current detection member arranged, at least in part, within the gap;
the holder is held by the housing;
the holder is formed with a plurality of holding holes which correspond to the contacts, respectively;
the core and the current detection member of each of the connectors are held in the corresponding one of the holding holes;
a part of the holder is located within the gap of the core of each of the connectors;
the contact of each of the connectors pierces the corresponding one of the holding holes along the front-rear direction; and
the protection member of each of the connectors is received in the corresponding one of the holding holes.

* * * * *